(12) United States Patent
Liang et al.

(10) Patent No.: US 11,485,908 B2
(45) Date of Patent: Nov. 1, 2022

(54) QUANTUM DOT LIGHT-EMITTING DIODE AND METHOD FOR FABRICATING THE SAME

(71) Applicant: TCL TECHNOLOGY GROUP CORPORATION, Huizhou (CN)

(72) Inventors: Zhurong Liang, Huizhou (CN); Weiran Cao, Huizhou (CN); Lei Qian, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 44 days.

(21) Appl. No.: 16/772,762

(22) PCT Filed: Jul. 18, 2019

(86) PCT No.: PCT/CN2019/096499
§ 371 (c)(1),
(2) Date: Jun. 12, 2020

(87) PCT Pub. No.: WO2020/015697
PCT Pub. Date: Jan. 23, 2020

(65) Prior Publication Data
US 2021/0371743 A1 Dec. 2, 2021

(30) Foreign Application Priority Data
Jul. 18, 2018 (CN) .......................... 201810804235.4

(51) Int. Cl.
*C09K 11/88* (2006.01)
*B82Y 20/00* (2011.01)
*B82Y 40/00* (2011.01)
*H01L 51/50* (2006.01)
*H01L 51/56* (2006.01)

(52) U.S. Cl.
CPC ............ *C09K 11/883* (2013.01); *B82Y 20/00* (2013.01); *B82Y 40/00* (2013.01); *H01L 51/502* (2013.01); *H01L 51/5016* (2013.01); *H01L 51/5072* (2013.01); *H01L 51/56* (2013.01); *H01L 2251/301* (2013.01)

(58) Field of Classification Search
CPC .............................. H01L 51/502; B82Y 20/00
See application file for complete search history.

(56) References Cited

U.S. PATENT DOCUMENTS

| 2015/0274995 A1* | 10/2015 | Dain | ...................... C09D 11/03 430/108.7 |
| 2020/0303646 A1* | 9/2020 | Tsuruta | ............... H01L 51/0004 |

FOREIGN PATENT DOCUMENTS

| CN | 1578561 A | 2/2005 |
| CN | 103904178 A | 7/2014 |
| CN | 105449110 A | 3/2016 |

(Continued)

*Primary Examiner* — Changhyun Yi
(74) *Attorney, Agent, or Firm* — Robert L. Stearns; Dickinson Wright, PLLC

(57) ABSTRACT

A quantum dot light-emitting diode and a method for fabricating the same. The quantum dot light-emitting diode, includes: an anode, a cathode, and a quantum dot light-emitting layer arranged between the anode and the cathode. A composite electron transport layer is arranged between the cathode and the quantum dot light-emitting layer, and the composite electron transport layer contains an electron transport material and an ultraviolet absorbing material.

20 Claims, 2 Drawing Sheets

(56) References Cited

FOREIGN PATENT DOCUMENTS

| | | | |
|---|---|---|---|
| CN | 105470387 | A | 4/2016 |
| CN | 105679958 | A | 6/2016 |
| CN | 106190113 | A | 12/2016 |
| CN | 106409995 | A | 2/2017 |
| CN | 106410055 | A | 2/2017 |
| CN | 107293647 | A | 10/2017 |
| CN | 107603340 | A | 1/2018 |
| CN | 109935714 | A | 6/2019 |
| CN | 108075043 | A | 11/2019 |
| WO | 2016120721 | A | 8/2016 |

* cited by examiner

QUANTUM DOT LIGHT-EMITTING DIODE AND METHOD FOR FABRICATING THE SAME

CROSS-REFERENCE TO RELATED APPLICATION

This application is a 35 U.S.C. § 371 national stage application of PCT Application Ser. No. PCT/CN2019/096499, filed on Jul. 18, 2019, which claims priority to Chinese Patent Application Ser. No. CN201810804235.4, filed on Jul. 18, 2018, the entire contents of which are incorporated herein by reference in its entireties.

TECHNICAL FIELD

The present application relates to the field of display technology, and more particularly to a quantum dot light-emitting diode and a method for fabricating the same.

BACKGROUND

Quantum dots (QDs), also called nano-crystallines, are a kind of particles having three dimensions smaller than or close to the Bohr radius (generally no more than 10 nm in diameter) and are usually nanoparticles made of II-VI group elements or III-V group elements. Due to the extremely small size of quantum dots, the movement of electrons therein in different directions is restricted. Therefore, their optical and electronic properties are different from those of the large particles, and feature special physical effects, such as quantum confinement effect, surface effect, quantum tunneling effect, and dielectric confinement effect. Quantum dot technology has a wide range of applications, such as semiconductor transistors, solar cells, light-emitting diodes (LEDs), quantum computing, and medical imaging. Among them, display technology is one of the most important fields of quantum dot applications. The quantum dot light-emitting diode (QLED) is an emerging display device, which adopts inorganic quantum dots having more stable performance as the light-emitting materials. Compared with organic fluorescent dyes, quantum dots are advantageous in good color saturation, adjustable spectrum, large luminous intensity, high color purity, long fluorescence lifetime, and excitation of multi-color fluorescence by a single light source. In addition, the QLED device has a long service duration and simple packaging process, and is expected to become the next generation of the flat panel display device, thereby having broad application prospects.

The current QLED device typically utilizes a metal oxide or metal sulfide semiconductor having high carrier mobility, such as zinc oxide, titanium dioxide, tin oxide, zirconium oxide, zinc sulfide, and cadmium sulfide, as an electron transport layer. In a specific application process, nanoparticles of such metal oxide or metal sulfide semiconductor are prepared using a solution method, and then a thin film is prepared by a solution film-forming method. Although possessing excellent electron injection and transport properties, such material is defect in the following aspects: in one aspect, due that such materials are nanoparticles synthesized by the solution method, a lot of defects exist on the surface and in the internal part thereof and will become recombination center of carriers, thereby leading fluorescence quenching of the device, and reducing the luminous performance of the device; in the other aspect, the metal oxide materials having excellent electron transport properties, such as titanium dioxide, zinc oxide, etc., have strong photocatalytic ability, that is, it can lead to photocatalytic effect under the excitation of photons. For example, when these materials are irradiated with photons having an energy greater than the forbidden band width, electrons will transit from a valence band to a conduction band, thereby generating electron-hole pairs, in which, electrons are reducing, holes are oxidizing, holes react with —OH (hydroxyl groups) on the surface of oxide semiconductor particles to generate highly oxidizing OH radicals, and the active OH radicals can oxidize many organic substances. While in the internal part of the QLED device, because the metal oxide electron transport layer is in direct contact with the quantum dot layer, the photocatalysis of the metal oxide (such as zinc oxide) can seriously damage the organic ligands on the surface of the quantum dot and affect the quantum dot material and the interfaces of quantum dots/zinc oxide and zinc oxide/metal cathode, thereby greatly reducing the luminescence life of QLED device. Therefore, the existing technology needs further study and development.

Technical Problems

It is an object of the present application to provide a quantum dot light-emitting diode and a method for fabricating the same, which aims at solving the technical problem that in the existing quantum dot light-emitting diode, a lot of defects exist on the surface of the electron transport material, which leads to luminescence quenching of the device and lowering the luminous performance of the device.

Technical Solutions

In order to achieve the above objects, the present application adopts the following technical solutions:

One aspect of the present application provides a quantum dot light-emitting diode, which comprises: an anode, a cathode, and a quantum dot light-emitting layer arranged between the anode and the cathode. A composite electron transport layer is arranged between the cathode and the quantum dot light-emitting layer, and the composite electron transport layer contains an electron transport material and an ultraviolet absorbing material.

Another aspect of the present application provides a method for fabricating a quantum dot light-emitting diode. The method comprises the following steps:

preparing a composite electron transport layer on a cathode or a quantum dot light-emitting layer, in which, the composite electron transport layer contains an electron transport material and an ultraviolet absorbing material.

Beneficial Effects

In the quantum dot light-emitting diode provided by the present application, the composite electron transport layer is arranged between the cathode and the quantum dot light-emitting layer, and the composite electron transport layer contains the electron transport material and the ultraviolet absorbing material. Functional groups in the ultraviolet absorbing material are combined with vacancies or dangling bonds on the surface of the electron transport material to passivate the surface defects of the electron transport material, thereby avoiding the luminescence quenching of the quantum dot light-emitting diode and in turn improving the luminous performance of the device.

The fabrication method of the quantum dot light-emitting diode provided by the present application is simple in process. The composite electron transport layer containing the electron transport material and the ultraviolet absorbing material is prepared on the cathode or the quantum dot light-emitting layer, the ultraviolet absorbing material in the composite electron transport layer can passivate the surface defects of the electron transport material, thereby avoiding the luminescence quenching of the quantum dot light-emitting diode and in turn improving the luminous performance of the device.

DETAILED DESCRIPTION OF THE EMBODIMENTS

Figure 1:
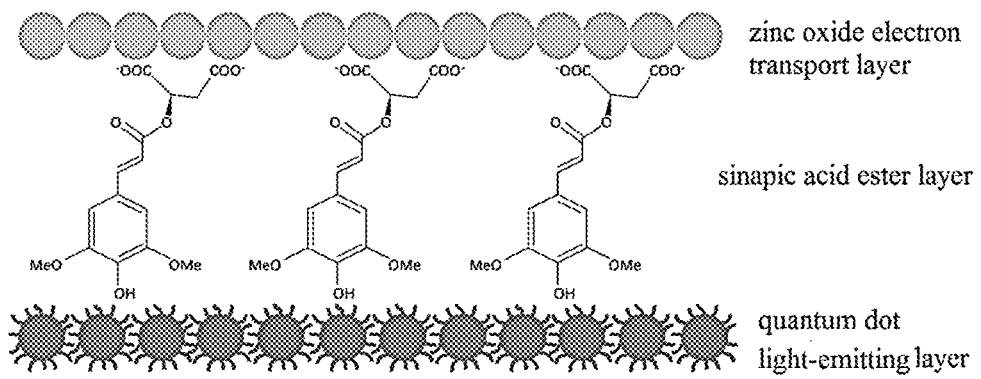
FIG. 1 is a schematic structural diagram of a composite electron transport layer of a quantum dot light-emitting diode according to an embodiment of the present application.

In order to make the technical problems, technical solutions, and beneficial effects to be solved by the present application clearer, the present application will be further described in detail below in accompany with the drawings and embodiments.

It should be understood that the specific embodiments described herein are only used to explain the present application, and are not intended to limit the present application.

It should be understood that the terms "first" and "second" in embodiments of the present application are used for description purposes only, and cannot be understood as indicating or implying relative importance or implicitly indicating the number of indicated technical features. Thus, the features defined as "first" and "second" may explicitly or implicitly include one or more of such features.

In one aspect, the present application provides a quantum dot light-emitting diode, which comprises: an anode, a cathode, and a quantum dot light-emitting layer arranged between the anode and the cathode. A composite electron transport layer is arranged between the cathode and the quantum dot light-emitting layer, and the composite electron transport layer contains an electron transport material and an ultraviolet absorbing material.

In the quantum dot light-emitting diode provided by the present application, the composite electron transport layer is arranged between the cathode and the quantum dot light-emitting layer, and the composite electron transport layer contains the electron transport material and the ultraviolet absorbing material. Functional groups in the ultraviolet absorbing material are combined with vacancies or dangling bonds on the surface of the electron transport material to passivate the surface defects of the electron transport material, thereby avoiding the luminescence quenching of the quantum dot light-emitting diode and in turn improving the luminous performance of the device.

Further, in the quantum dot light-emitting diode provided by an embodiment of the present application, the composite electron transport layer comprises: an electron transport layer made of the electron transport material, and an interfacial modification layer made of the ultraviolet absorbing material, in which, the interfacial modification layer is arranged between the electron transport layer and the cathode, or alternatively, the interfacial modification layer is arranged between the electron transport layer and the quantum dot light-emitting layer. Or alternatively, the composite electron transport layer comprises: a first interfacial modification layer, an electron transport layer, and a second interfacial modification layer that are stacked; the electron transport layer is made of the electron transport material, and the first interfacial modification layer and the second interfacial modification layer are made of the ultraviolet absorbing material, in which, the first interfacial modification layer is arranged between the electron transport layer and the cathode, and the second interfacial modification layer is arranged between the electron transport layer and the quantum dot light-emitting layer. That is, the interfacial modification layer in the embodiment of the present application may be one layer stacked between the electron transport layer and the cathode; or alternatively, the interfacial modification layer may be one layer stacked between the electron transport layer and the quantum dot light-emitting layer; or alternatively, the interfacial modification layer can be two layers, with one layer arranged between the electron transport layer and the cathode and the other layer arranged between the electron transport layer and the quantum dot light-emitting layer. The interfacial modification layer made of the ultraviolet absorbing material is arranged on the surface of the electron transport layer, which can passivate the surface defects of the electron transport layer; in addition, coordination groups contained in the ultraviolet absorbing material (as hydroxyl groups or carboxyl groups of sinapic acid ester shown in FIG. 1) can also functions in interface modification and enhancing the degree of the bonding between the two interfaces. Furthermore, when the composite electron transport layer includes one interfacial modification layer, the interfacial modification layer has a thickness of 2-90 nm. When the composite electron transport layer includes the first interfacial modification layer and the second interfacial modification layer, both the first interfacial modification layer and the second interfacial modification layer have the thickness of 2-90 nm.

Further, in the quantum dot light-emitting diode provided by an embodiment of the present application, the composite electron transport layer is formed by a mixture of the electron transport material and the ultraviolet absorbing material. The ultraviolet absorbing material can passivate the surface defects of the electron transport material. When the ultraviolet absorbing material is mixed with the electron transport material, the ultraviolet absorbing material can passivate the internal defects of the composite electron transport layer. Further, when the composite electron transport layer is formed by a mixture of the electron transport material and the ultraviolet absorbing material, the composite electron transport layer has a thickness of 2-170 nm. In an embodiment, the electron transport material and the ultraviolet absorbing material are mixed at a molar ratio of (0.05-200):(0.03-90).

Further, in the quantum dot light-emitting diode provided by an embodiment of the present application, the above electron transport material is selected from a metal oxide electron transport material. The metal oxide electron transport material (such as titanium dioxide, zinc oxide, etc.) has excellent electron transport property, but also has strong photocatalytic capability, that is, having photocatalytic effect under the excitation of photons. Under the photocatalytic effect of the metal oxide electron transport material, the ultraviolet light or the light containing an ultraviolet component damages inorganic materials (including quantum dot materials, oxide nanoparticle materials, etc.) inside the device and/or organic materials (including nanoparticle surface ligands, organic transport layer, organic modification layer, etc.), resulting in adverse effects on material property and device performance, such as quantum dot surface ligand shedding, quantum dot reunion, increased nanoparticle surface defects, increased interface defects of the functional layer, changes in particle energy band, increased carrier transport barrier, etc. In the embodiment of the present application, one or more of the ultraviolet absorbing material is introduced into the interface between the quantum dot light-emitting layer and the electron transport layer made of the metal oxide electron transport material, and/or inside the electron transport layer made of the metal oxide electron transport material, and/or into the interface between the electron transport layer made of the metal oxide electron transport material and the cathode, that is, the metal oxide electron transport materials and ultraviolet absorbing material are mixed to form the composite electron transport layer, or alternatively, at least one surface of the electron transport layer made of the metal oxide electron transport material is provided with the interfacial modification layer made of the ultraviolet absorbing material. In this way, not only can the surface defects of the metal oxide electron transport material be passivated, but also the impact of ultraviolet light on device materials and device performance is inhibited, thereby ultimately improving the device performance and extending the device life.

Further, the above ultraviolet absorbing material is at least one selected from the group consisting of cinnamic acid, a cinnamic acid derivative, salicylic acid, a salicylic acid derivative, methoxyphenone, a methoxyphenone derivative, benzotriazole, a benzotriazole derivative, cyanoacrylic acid, a cyanoacrylic acid derivative, triazine, a triazine derivative, benzoic acid, the benzoic acid derivative, a hindered amine compound, an organic nickel compound, phenylbenzimidazole sulfonic acid, terephthalylidene dicamphor sulfonie acid, drometrizde trisiloxane, butyl methoxydibenzoylmethane, and 3-(4-methylbenzylidene)-camphor. In other words, the ultraviolet absorbing material may be any one selected from said group, for example, cinnamic acid , or a cinnamic acid derivative, or salicylic acid; the ultraviolet absorbing material may be any two selected from said group, for example, cinnamic acid and a cinnamic acid derivative; or salicylic acid and a salicylic acid derivative; or methoxyphenone and a methoxyphenone derivative; and the ultraviolet absorbing material may be any three selected from said group, for example, cinnamic acid, a cinnamic acid derivative, and salicylic acid; or a salicylic acid derivative, methoxyphenone, and a methoxyphenone derivative; etc.

In the above ultraviolet absorbing material: the cinnamic acid derivative is at least one selected from the group consisting of octyl methoxycinnamate, isooctyl methoxycinnamate, 2-ethylhexyl 4-methoxycinnamate, pentaerythrityl tetra-di-t-butyl hydroxyhydrocinnamate, sinapic acid, and a sinapic acid derivative (such as one or more of sinapic acid ester, sinapoyl glucose, sinapoyl malate, sinapoyl choline). In other words, the cinnamic acid derivative may be any one selected from said group, for example, octyl methoxycinnamate, or isooctyl methoxycinnamate, or 2-ethylhexyl 4-methoxycinnamate, or pentaerythrityl tetra-di-t-butyl hydroxyhydrocinnamate; the cinnamic acid derivative may be any two selected from said group, for example, octyl methoxycinnamate and isooctyl methoxycinnamate, or 2-ethylhexyl 4-methoxycinnamate and pentaerythrityl tetra-di-t-butyl hydroxyhydrocinnamate; and the cinnamic acid derivative may be any three selected from said group, for example, octyl methoxycinnamate, isooctyl methoxycinnamate, and 2-ethylhexyl 4-methoxycinnamate; or pentaerythrityl tetra-di-t-butyl hydroxyhydrocinnamate, sinapic acid, and a sinapic acid derivative; etc. The salicylic acid derivative is at least one selected from the group consisting of octyl salicylate, homosalate, phenyl 3,5-dichlorosalicylate, 4,4'-isopropylidene-bis(phenolsalicylate), p-tert-butylphenyl salicylate, and p-octylphenyl salicylate. In other words, the salicylic acid derivative may be any one selected from said group, for example, octyl salicylate, or homosalate, or phenyl 3,5-dichlorosalicylate, or 4,4'-isopropylidene-bis(phenolsalicylate), or p-tert-butylphenyl salicylate, or p-octylphenyl salicylate, the salicylic acid derivative may be any two selected from said group, for example, octyl salicylate and homosalate, or phenyl 3,5-dichlorosalicylate and 4,4'-isopropylidene-bis(phenolsalicylate), or p-tert-butylphenyl salicylate and p-octylphenyl salicylate, and the salicylic acid derivative may be any three selected from said group, for example, octyl salicylate, homosalate, and phenyl; or 3,5-dichlorosalicylate, 4,4'-isopropylidene-bis(phenolsalicylate), and p-tert-butylphenyl salicylate; etc. The methoxyphenone derivative is at least one selected from the group consisting of 2-hydroxy-4-n-octyloxybenzophenone, 2-hydroxy-4-methoxybenzophenone, 2,4-dihydroxybenzophenone, benzophenone-3, 2-hydroxy-4-(2'-ethylhexoxy)-benzophenone, 2-hydroxy-4-dodecyl-benzophenone, 2-hydroxy-4-methoxy-2'-carboxybenzophenone, 2-hydroxy-4 (2'-hydroxy-3'-acryloxypropoxy) benzophenone, 2-hydroxy-4-[2'-hydroxy-3'-(methacryloxypropoxy)] benzophenone, 2,2'- dihydroxy-4-n-octyloxybenzophenone, 2-hydroxy-4-methoxy-4-chlorobenzophenone, 2-hydroxy-4-methoxy-2',4'-dichlorobenzophenone, 1,3-bis(3'-hydroxy-4'- benzoylphenoxy)-2-propanol, 2-hydroxy-4-octadecyloxybenzophenone, 2,2'-dihydroxy-methoxybenzophenone, 2,2'-dihydroxy-4,4'-dimethoxybenzophenone, 2,2',4,4'-tetrahydroxybenzophenone, and 2-hydroxy-4-acryloyloxyethoxybenzophenone. In other words, the methoxyphenone derivative may be any one selected from said group, for example, 2-hydroxy-4-n-octyloxybenzophenone, or 2-hydroxy-4-methoxybenzophenone; the methoxyphenone derivative may be any two selected from said group, for example, 2-hydroxy-4-n-octyloxybenzophenone and 2-hydroxy-4-methoxybenzophenone, or 2,4-dihydroxybenzophenone and benzophenone-3, the methoxyphenone derivative may be any two selected from said group, for example, 2-hydroxy-4-n-octyloxybenzophenone, 2-hydroxy-4-methoxybenzophenone, and 2,4-dihydroxybenzophenone; or benzophenone-3, 2-hydroxy-4-(2'- ethylhexoxy)-benzophenone, and 2-hydroxy-4-dodecyl-benzophenone; etc. The benzotriazole derivative is at least one selected from the group consisting of 2-(2'-hydroxy-3',5'-di-tert-phenyl)-5-chlorobenzotriazole, 2-(2'-hydroxy-5'-methylphenyl)benzotriazole, 2-(2'-hydroxy-5'-methylphenyl)benzotriazole, (2'-hydroxy-3'-tert-butyl-5'-methylphenyl)-5-chlorobenzotrizole, 2-(2'-hydroxy-3',5'-di-tert-butylphenyl)-5-chlorobenzotriazole, methyl 3-(3-(2H-benzotriazol-2-yl) 5-tert-butyl-4-hydroxyphenyl) acrylate, 2-(2'-hydroxy-3',5'-dipentylphenyl)benzotriazole, 2-(2'-hydroxy-4'-n-octyloxyphenyl)benzotriazole, 2-(2'-hydroxy-5'-tert-octylphenyl)benzotriazole, 2-(2H- benzotriazol-2-yl)-4-(tert-butyl-6-sec-butyl)phenol, 2-(2H-benzotriazol-2-yl)-4, 6-bis(1-methyl-1-phenylethyl)phenol, 2,2'-methylenebis(6-(2H-benzotriazol- 2-yl)-4-(1,1,3,3-tetramethylbutyl) phenol), 2-(2H-benzotriazol-2-yl)-6-(dodecyl)-4-methylphenol, and methylenebis-benzotriazolyltetramethylbutylphenol. In other words, the benzotriazole derivative may be any one selected from said group, for example, 2-(2'-hydroxy-3', 5'-di-tert-phenyl)-5-chlorobenzotriazole, or 2-(2'-hydroxy-5'-methylphenyl)benzotriazole; the benzotriazole derivative may be any two selected from said group, for example, 2-(2'-hydroxy-3',5'-di-tert-phenyl)-5-chlorobenzotriazole and 2-(2'-hydroxy -5'-methylphenyl)benzotriazole, or 2-(2'-hydroxy-5'-methylphenyl)benzotriazole and (2'-hydroxy-3'-tert-butyl-5'-methylphenyl)-5-chlorobenzotriazole; the benzotriazole derivative may be any three selected from said group, for example, 2-(2'-hydroxy-3',5'-di-tert-phenyl)-5-chlorobenzotriazole, 2-(2'-hydroxy-5'-methylphenyl)benzotriazole, and 2-(2'-hydroxy-5'-methylphenyl)benzotriazole; or (2'-hydroxy-3'-tert-butyl-5'-methylphenyl)-5-chlorobenzotriazole, 2-(2'-hydroxy-3'-di-tert -butylphenyl)-5-chlorobenzotriazole, and methyl 3-(3-(2H-benzotriazol-2-yl)5-tert-butyl-4-hydroxyphenyl) acrylate; etc. The cyanoacrylic acid derivative is at least one selected from the group consisting of 2-cyano-3,3-diphenylacrylic acid 2-ethylhexyl ester, 2-cyano-3,3'-diphenyl ethyl acrylate, and 2-cyano-3,3-diphenyl isooctyl acrylate. In other words, the cyanoacrylic acid derivative may be any one selected from said group, for example, 2-cyano-3,3-diphenylacrylic acid 2-ethylhexyl ester, or 2-cyano-3,3'-diphenyl ethyl acrylate, or 2-cyano-3,3-diphenyl isooctyl acrylate; the cyanoacrylic acid derivative may be any two selected from said group, for example, 2-cyano-3,3-diphenylacrylic acid 2-ethylhexyl ester and 2-cyano-3,3'-diphenyl ethyl acrylate, or 2-cyano-3,3-diphenylacrylic acid 2-ethylhexyl ester and 2-cyano-3,3-diphenyl isooctyl acrylate, or 2-cyano-3,3'-diphenyl ethyl acrylate and 2-cyano-3,3-diphenyl isooctyl acrylate; and the cyanoacrylic acid derivative may be the three selected from said group, for example, 2-cyano-3,3-diphenylacrylic acid 2-ethylhexyl ester, 2-cyano-3,3'-diphenyl ethyl acrylate, and 2-cyano-3,3-diphenyl isooctyl acrylate. The triazine derivative is at least one selected from the group consisting of 2,4,6-tris(2'n-butoxyphenyl) -1,3,5-triazine, ethylhexyl triazinone, diethylhexylbutyramidotriazinone, tris(2,2,6,6-tetramethyl-4-oxy-piperidinyl)-1,3,5-triazine, 2-(4,6-diphenyl-1,3,5-triazin-2-yl)-5-[(hexyl) oxy]-phenol, 2-[4,6-bis(2, 4-xylyl)-2-(1,3,5-triazinyl)]-5-octyloxyphenol, and bis-ethylhexyloxyphenol methoxyphenyl triazine. In other words, the triazine derivative may be any one selected from said group, for example, 2,4,6-tris(2'n-butoxyphenyl) -1,3, 5-triazine or ethylhexyl triazinone, diethylhexylbutyramidotriazinone, the triazine derivative may be any two selected from said group, for example, 2,4,6-tris(2'n-butoxy phenyl) -1,3,5-triazine and ethylhexyl triazinone, or diethylhexylbutyramidotriazinone and tris(2,2,6,6-tetramethyl-4-oxy-piperidinyl)-1,3,5-triazine; and the triazine derivative may be any three selected from said group, for example, 2,4,6-tris(2'n-butoxyphenyl) -1,3,5-triazine, ethylhexyl triazinone, and diethylhexylbutyramidotriazinone; etc. The benzoic acid derivative is at least one selected from the group consisting of diethylaminohydroxybenzoyl hexyl benzoate, 2-ethylhexyl-4-dimethylaminobenzoate, octyl-dimethyl-p-aminobenzoic acid, phenyl 2-hydroxybenzoate, m-phenylene dibenzoate, 3,5-di-tert-butyl-4-hydroxybenzoic acid-2,4-di-tert-butylphenyl ester, and 3,5-di-tert-butyl-4-hydroxybenzoic acid n-hexadecyl ester. In other words, the benzoic acid derivative may be any one selected from said group, for example, diethylaminohydroxybenzoyl hexyl benzoate, or 2-ethylhexyl-4-dimethylaminobenzoate, or octyl-dimethyl-p-aminobenzoic acid; the benzoic acid derivative may be any two selected from said group, for example, diethylaminohydroxybenzoyl hexyl benzoate and 2-ethylhexyl-4-dimethylaminobenzoate; the benzoic acid derivative may be any three selected from said group, for example, diethylaminohydroxybenzoyl hexyl benzoate, 2-ethylhexyl-4-dimethylaminobenzoate, and octyl-dimethyl-p-aminobenzoic acid; etc. The hindered amine compound is at least one selected from the group consisting of ethyl bis (2,2,6,6-tetramethylpiperazinone), 4-benzoyloxy-2,2,6,6 tetramethylpiperidine, 2-(3,5-di-tert-butyl-4-hydroxy-benzyl)-2-butyl 1,3-malonic acid bis (1,2,2,6,6-pentamethyl-4-piper pyridyl) ester, tetra(2,2,6,6-tetramethyl-4-piperidinyl)-1,2,3,4-butane tetracarboxylate, bis (2,2,6,6-tetramethylpiperidinyl) sebacate, poly-{[6-[(1,1,3,3-tetramethylbutyl) -imino]-1,3,5, -triazine-2,4-diyl] [2-(2,2, 6,6-tetramethylpiperidinyl) -imino-hexamethylene- [4-(2,2, 6,6-tetramethylpyridinyl) -imino]], polymers of succinic acid and 4-hydroxy-2,2,6,6-tetramethyl-l-piperidinol, [[6-[(1, 1, 3,3-tetramethylbutyl) amino] s-triazine-2,4-di] [[(2, 2,6,6-tetramethyl-4-piperidinyl) imino] hexylidene [(2,2,6, 6-tetramethyl-4-piperidinyl) imino]] polymer, bis (or tri) (2,2,6,6-tetramethyl-4-piperidinyl) -bis (or mono) tridecyl-1,2,3,4-butane tetracarboxylate, bis (or tri) (1,2,2,6,6-pentamethyl-4-piperidinyl) -bis (or mono) tridecyl-1,2,3,4-butane tetracarboxylic acid ester, 4-(p-toluenesulfonamido) -2,2,6,6-tetramethylpiperidine, bis (1,2,2,6,6-pentamethyl 4-piperidinyl) -sebacate, N-triacetic acid (2,2,6,6-tetramethyl-4-piperidinyl) ester, N-triacetic acid (1,2,2,6,6-pentamethyl-4-piperidinyl) ester, tris (1,2,2,6,6-pentamethyl-4-piperidinyl) -phosphite, poly-(4(2,2,6,6-tetramethylpiperidinyl) imino-hexamethylene [4-(2,2,6,6-tetramethylpiperidinyl) imino]-ethylene, bis(1-octyloxy-2,2, 6,6-tetramethyl-4-piperidinyl) sebacate, and hexamethylphosphoric triamide. In other words, the hindered amine compound may be any one selected from said group, for example, ethyl bis (2,2,6,6-tetramethylpiperazinone), or 4-benzoyloxy-2,2,6,6tetramethylpiperidine; the hindered amine compound may be any two selected from said group, for example, ethyl bis (2,2,6,6-tetramethylpiperazinone) and 4-benzoyloxy -2,2,6,6tetramethylpiperidine, or 2-(3,5-di-tert-butyl-4-hydroxy-benzyl)-2-butyl 1,3-malonic acid bis (1,2,2,6,6-pentamethyl-4-piper pyridyl) ester and tetra(2,2,6,6-tetramethyl -4-piperidinyl)-1,2,3,4-butane tetracarboxylate; the hindered amine compound may be any three selected from said group, for example, ethyl bis (2,2,6,6-tetramethylpiperazinone), 4-benzoyloxy-2,2,6,6tetramethylpiperidine, and 2-(3,5-di-tert-butyl-4-hydroxybenzyl)-2-butyl 1,3-malonic acid bis (1,2,2,6,6-pentamethyl-4-piper pyridyl) ester; etc. The organic nickel compound is at least one selected from the group consisting of nickel tetra-n-butyl dithiocarbamate, 2,2'-thiobis (p-tert-octylphenol) nickel-n-butylamine complex, 2,2'-thiobis (p-tert-octylphenol) nickel, and 2,2'-thiobis (4-tert-octylphenoloxy) nickel.

The ultraviolet absorbing material is optionally selected from hydroxycinnamic acid derivatives, and specifically selected from the group consisting of sinapic acid, sinapic acid ester, and derivatives thereof, which includes but are not limited to one or more of sinapoyl glucose, sinapoyl malate, and sinapoyl choline. Specifically, sinapic acid ester is a lipid derivative of sinapic acid, which is a type of hydroxycinnamic acid derivatives abundant in *Arabidopsis* and other cruciferous plants. In plants, it is evenly distributed on leave surfaces, and protects the life processes such as plant photosynthesis from excessive ultraviolet rays, thus being a natural green environmental protective ultraviolet absorbing material. Sinapic acid ester is able to effectively absorb ultraviolet light, when absorbing the ultraviolet light and reaching an electronically excited state, it will be switched back to a ground state through fast light isomerization, thereby effectively avoiding the adverse effects of ultraviolet light components on the QLED device performance inside the QLED device.

As shown in FIG. 1: the chemical structure of sinapic acid ester has one end with abundant carboxyl groups, which can be well anchored on the surface of the electron transport layer made of the metal oxide electron transport material (such as the zinc oxide electron transport layer shown in FIG. 1, the ultraviolet absorbing material is arranged at the interface between the quantum dot light-emitting layer and the electron transport layer, and/or the interface between the electron transport layer and the cathode), and/or connected with the nanoparticles of the metal oxide electron transport material in the composite electron transport layer (the ultraviolet absorbing material and the metal oxide electron transport materials are mixed to form the composite electron transport layer). While the other end contains hydroxyl and methoxy groups, which can well anchored to the surface of the quantum dot light-emitting layer (when the ultraviolet absorbing material is arranged at the interface between the quantum dot light-emitting layer and the electron transport layer) or well anchored to the cathode surface (when the ultraviolet absorbing material is arranged at the interface between the electron transport layer and the cathode), thereby effectively connecting the upper and lower layers and effectively passivating the defect states and dangling bonds on the material surface of the electron transport layer. In addition, sinapic acid ester has a conjugated structure, which are capable of effectively increasing the injection and transmission efficiency of carriers through the conjugated structure after being connected to the upper and lower functional layers.

In the quantum dot light-emitting diode provided by an embodiment of the present application, the electron transport layer is one or more selected from the group consisting of doped or undoped metal oxides, and doped or undoped metal sulfides.

Among them, the doped or undoped metal oxides comprises one or more of ZnO, $TiO_2$, $SnO_2$, $Ta_2O_3$, $ZrO_2$, NiO, TiLiO, ZnAlO, ZnMgO, ZnSnO, ZnLiO, and InSnO.

The doped or undoped metal sulfides comprise one or more of CdS, ZnS, MoS, WS, and CuS.

The quantum dot light-emitting layer is made of one or more of II-VI compounds, III-V compounds, II-V compounds, III-VI compounds, IV-VI compounds, I-III-VI compounds, II-IV-VI compounds, and IV simple substances.

Specifically, the semiconductor materials used in the quantum dot light-emitting layer include, but are not limited to, nano-crystalline of II-VI semiconductors, such as CdS, CdSe, CdTe, ZnS, ZnSe, ZnTe, HgS, HgSe, HgTe, PbS, PbSe, PbTe, and other binary, ternary, and quaternary II-VI compounds, and nano-crystalline of III-V group semiconductors, such as GaP, GaAs, InP, InAs, and other binary, ternary and quaternary III-V compounds. The semiconductor materials configured for electroluminescence are not limited to II-V compounds, III-VI compounds, IV-VI compounds, I-III-VI compounds, II-IV-VI compounds, and IV simple substances. The material for the quantum dot light-emitting layer may also be a doped or undoped inorganic perovskite semiconductor, and/or an organic-inorganic hybrid perovskite semiconductor. Specifically, the inorganic perovskite semiconductor has a structural formula of $AMX_3$, where A is $Cs^+$ ion, M is a divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co2+$, $Fe^{2+}$, $Ge^{2+}$, $Yb^{2+}$, $Eu^{2+}$, and X is halogen anion, including but not limited to $Cl^-$, $Br^-$, $I^-$. The organic-inorganic hybrid perovskite semiconductor has a structural formula of $BMX_3$, where B is an organic amine cation, including but not limited to $CH_3(CH_2)_{n-2}NH_3^+$ (n≥2) or $NH_3(CH_2)_nNH_3^{2+}$ (n≥2). When n=2, the inorganic metal halide octahedrons $MX_6^{4-}$ are connected in a manner of co-apex, the metal cation M is located in the body center of each halogen octahedron, and the organic amine cations B are filled in the gap between the octahedrons, forming an infinitely extending three-dimensional structure. When n>2, the inorganic metal halide octahedrons $MX_6^{4-}$ connected in the manner of co-apex extend in a two-dimensional direction to form a layered structure, and an organic amine cationic bilayer (protonated monoamine) or organic amine cation monolayer (protonated diamine) is intercalated in the layered structure, the organic layer and the inorganic layer overlap to form a stable two-dimensional layered structure; M is a divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co2+$, $Fe^{2+}$, $Ge^{2+}$, $Yb^{2+}$, and $Eu^{2+}$; X is a halogen anion, including but not limited to $Cl^-$, $Br^-$, and $I^-$.

The quantum dot light-emitting diode may be disposed on a substrate, the substrate is a rigid substrate or a flexible substrate, and the rigid substrate includes but is not limited to glass and metal foil. The flexible substrate includes but is not limited to one or more of polyethylene terephthalates (PET), polyethylene naphthalates (PEN), polyetheretherketones (PEEK), polystyrenes (PS), polyethersulfones (PES), polycarbonates (PC), polyarylates (PAT), polyarylates (PAR), polyimides (PI), polyvinyl chlorides (PVC), polyethylenes (PE), polyvinylpyrrolidones (PVP), and textile fibers. The anode and the cathode include but are not limited to one or more of metal materials, carbon materials, and metal oxides. The metal material includes one or more of Al, Ag, Cu, Mo, Au, Ba, Ca, and Mg. The carbon material includes one or more of graphite, carbon nanotubes, graphene, and carbon fibers. The metal oxide may be doped or undoped metal oxide, including one or more of ITO, FTO, ATO, AZO, GZO, IZO, MZO, AMO, and may also include a composite electrode formed by sandwiching metals between the doped or undoped metal oxide, where the composite electrode includes AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, and $TiO_2$/Al/$TiO_2$. In particular, the anode and the cathode of different materials can be used to construct the quantum dot light-emitting diode with different light emitting characteristics, including top-emitting devices, bottom-emitting devices, and fully transparent devices.

In addition, an electron injection layer may be arranged between the composite electron transport layer and the cathode, and a hole blocking layer may be arranged between the composite electron transport layer and the quantum dot light-emitting layer. A hole function layer (for example, a hole transport layer, or a hole injection layer and a hole transport layer that are stacked) is arranged between the anode and the quantum dot light-emitting layer. An electron blocking layer may be arranged between the hole function layer and the quantum dot light-emitting layer. The hole injection layer is one or more selected from the group consisting of PEDOT:PSS, CuPc, F4-TCNQ, HATCN, transition metal oxides, and transition metal chalcogenides. The transition metal oxides comprise one or more of NiOx, MoOx, WOx, CrOx, and CuO. The transition metal chalcogenides comprise one or more of MoSx, MoSex, WSx, WSex, and CuS. The hole transport layer is at least one selected from the group consisting of poly(9,9-dioctylfluorene-co-N-(4-butylphenyl)diphenylamine), polyvinylcarbazole, poly[N,N'-bis(4-butylphenyl)-N,N'-bis(phenyl)-benzidine], poly(9,9-dioctylfluorene-co-bis-N,N-phenyl-1,4-phenylenediamine), 4,4',4''-tris(carbazol-9-yl)-triphenylamine, 4,4'-bis(9-carbazolyl)-1,1'-biphenyl, N,N'-bis-(3-methylphenyl)-N,N'-Bis-phenyl-(1,1'-biphenyl)-4,4'-diamine, N,N'-Bis(1-naphthalenyl)-N,N'-bisphenyl-(1,1'-biphenyl)-4,4'-diamine, graphene, and C60. As another embodiment, the hole transport layer is selected from inorganic materials having hole transport capabilities, including but not limited to at least one of NiOx, MoOx, WOx, CrOx, CuO, MoSx, MoSex, WSx, WSex, and CuS.

Another aspect of the present application provides a method for fabricating a quantum dot light-emitting diode, and the method comprises the following steps:

preparing a composite electron transport layer on a cathode or a quantum dot light-emitting layer, in which, the composite electron transport layer contains an electron transport material and an ultraviolet absorbing material.

In the quantum dot light-emitting diode provided by embodiments of the present application, the composite electron transport layer is arranged between the cathode and the quantum dot light-emitting layer. The composite electron transport layer contains the electron transport material and the ultraviolet absorbing material, the ultraviolet absorbing material can passivate the surface defects of the electron transport material, thereby avoiding the luminescence quenching of the quantum dot light-emitting diode and in turn improving the luminous performance of the device.

In the above fabrication method, when the substrate is an anode substrate, the quantum dot light-emitting layer is arranged on a surface of the anode substrate, the composite electron transport layer containing the electron transport material and the ultraviolet absorbing material is prepared on the quantum dot light-emitting layer, and the cathode is subsequently prepared on the composite electron transport layer (thereby obtaining a quantum dot light-emitting diode in a positive structure). When the substrate is a cathode substrate, the composite electron transport layer containing the electron transport material and the ultraviolet absorbing material is prepared on the cathode substrate, and the quantum dot light-emitting layer is subsequently prepared on the composite electron transport layer, and then the anode is prepared on the quantum dot light-emitting layer (thereby obtaining a quantum dot light-emitting diode in an inverted structure).

Figure 2:
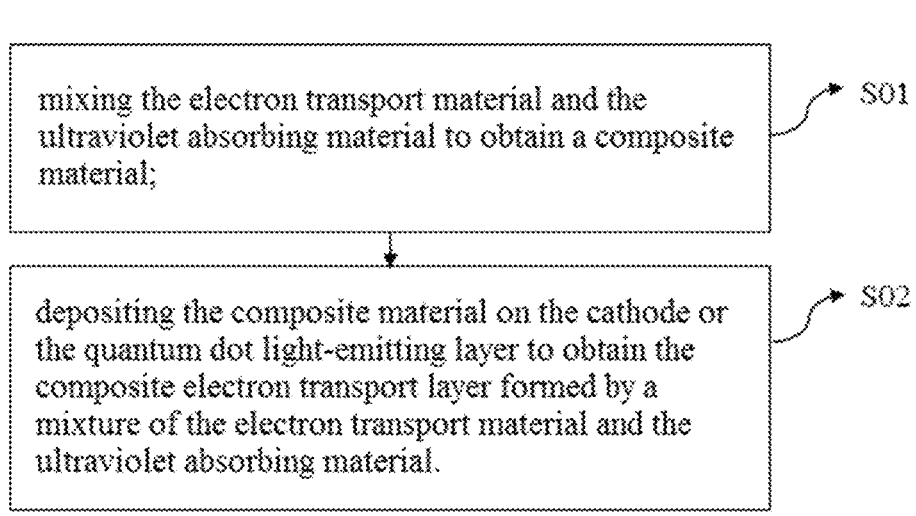
FIG. 2 is a schematic flow chart of a method for fabricating a quantum dot light-emitting diode according to an embodiment of the present application.

Further, as shown in FIG. 2, the step of preparing a composite electron transport layer on a cathode or a quantum dot light-emitting layer comprises:

S01: mixing the electron transport material and the ultraviolet absorbing material to obtain a composite material; and S02: depositing the composite material on the cathode or the quantum dot light-emitting layer to obtain the composite electron transport layer formed by a mixture of the electron transport material and the ultraviolet absorbing material.

Therefore, in the finally obtained quantum dot light-emitting diode, the composite electron transport layer is a composite electron transport layer formed by a mixture of the electron transport material and the ultraviolet absorbing material.

In particular, the step of depositing the composite material on the cathode or the quantum dot light-emitting layer to obtain the composite electron transport layer formed by a mixture of the electron transport material and the ultraviolet absorbing material, comprises: dissolving the composite material in a solvent to prepare a mixed solution, then depositing the mixed solution on the cathode or the quantum dot light-emitting layer, and performing annealing treatment.

Figure 3:
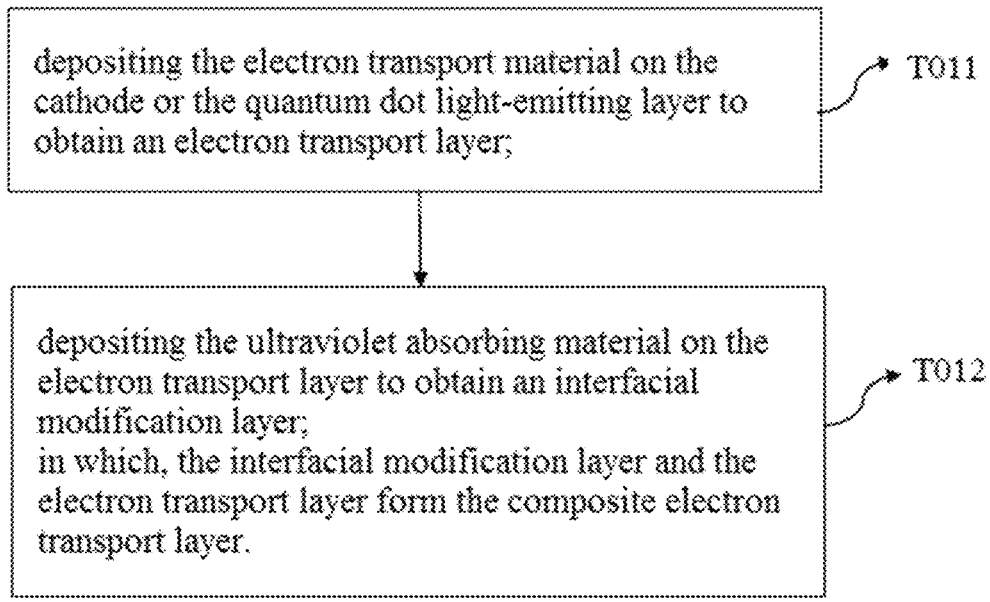
FIG. 3 is another schematic flow chart of a method for fabricating a quantum dot light-emitting diode according to the embodiment of the present application.

Further, as shown in FIG. 3, the step of preparing a composite electron transport layer on a cathode or a quantum dot light-emitting layer comprises:

T011: depositing the electron transport material on the cathode or the quantum dot light-emitting layer to obtain an electron transport layer; and T012: depositing the ultraviolet absorbing material on the electron transport layer to obtain an interfacial modification layer;

in which, the interfacial modification layer and the electron transport layer form the composite electron transport layer.

Figure 4:
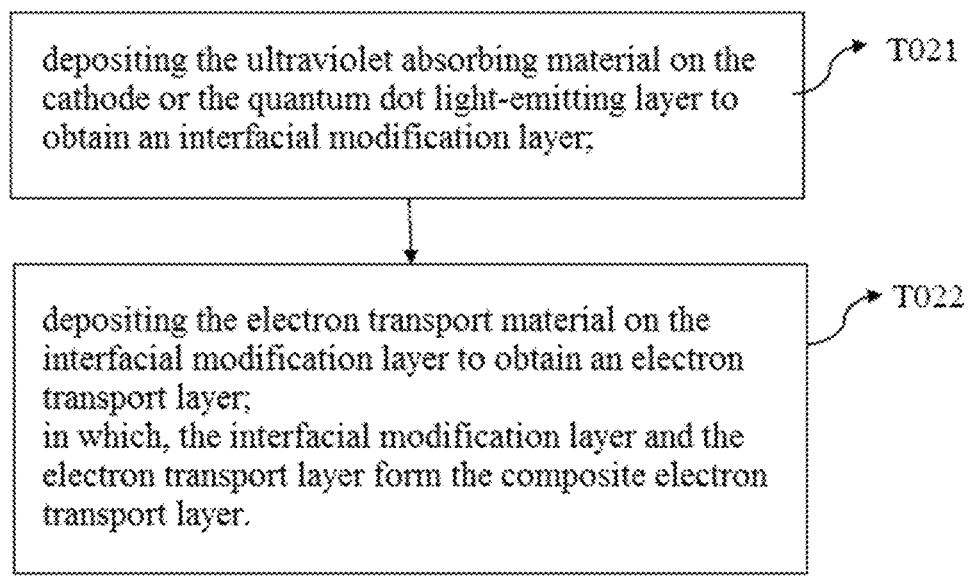
FIG. 4 is still another schematic flow chart of a method for fabricating a quantum dot light-emitting diode according to the embodiment of the present application.

Or alternatively, as shown in FIG. 4, the step of preparing a composite electron transport layer on a cathode or a quantum dot light-emitting layer comprises:

T021: depositing the ultraviolet absorbing material on the cathode or the quantum dot light-emitting layer to obtain an interfacial modification layer; and T022: depositing the electron transport material on the interfacial modification layer to obtain an electron transport layer;

in which, the interfacial modification layer and the electron transport layer form the composite electron transport layer.

Or alternatively, the first interfacial modification layer, the electron transport layer, and the second interfacial modification layer are sequentially prepared and stacked on the cathode or the quantum dot light-emitting layer. In this way, in the quantum dot light-emitting diode finally obtained, the composite electron transport layer comprises the electron transport layer made of the electron transport material and the interfacial modification layer made of the ultraviolet absorbing material, and the interfacial modification is arranged on at least one side of the electron transport layer.

In step T102, the step of depositing the ultraviolet absorbing material on the electron transport layer to obtain an interfacial modification layer comprises: dissolving the ultraviolet absorbing material in a solvent to obtain an ultraviolet absorbing material-containing solution, then depositing the ultraviolet absorbing material-containing solution on the electron transport layer, and performing annealing treatment.

In step T021, the step of depositing the ultraviolet absorbing material on the cathode or the quantum dot light-emitting layer to obtain an interfacial modification layer comprises: dissolving the ultraviolet absorbing material in a solvent to obtain an ultraviolet absorbing material-containing solution, then depositing the ultraviolet absorbing material-containing solution on the cathode or the quantum dot light-emitting layer, and performing annealing treatment.

The quantum dot light-emitting diode obtained by the above fabrication method may be partially encapsulated, fully encapsulated, or not encapsulated, which is not strictly limited in the embodiments of the present application.

For the composite electron transport layer formed by the interfacial modification layer and the electron transport layer, the following four cases are included:

In particular, in a preferred embodiment, a method for fabricating a quantum dot light-emitting diode in a positive structure comprises the following steps:

Step S1: preparing an anode on the substrate;

Step S2: preparing a hole injection layer on the anode;

Step S3: preparing a hole transport layer on the hole injection layer;

Step S4: preparing a quantum dot light-emitting layer on the hole transport layer;

Step S5: introducing the interfacial modification layer made of the ultraviolet absorbing material as described in the above onto the quantum dot light-emitting layer;

Step S6: preparing an electron transport layer on the interfacial modification layer; and Step S7: preparing the cathode on the electron transport layer to obtain the quantum dot light-emitting diode.

In particular, in a preferred embodiment, a method for fabricating a quantum dot light-emitting diode in a positive structure comprises the following steps:

Step S1: preparing an anode on a substrate;

Step S2: preparing a hole injection layer on the anode;

Step S3: preparing a hole transport layer on the hole injection layer;

Step S4: preparing a quantum dot light-emitting layer on the hole transport layer;

Step S5: preparing an electron transport layer on the quantum dot light-emitting layer;

Step S6: introducing the interfacial modification layer made of the ultraviolet absorbing material as described in the above onto the electron transport layer;

Step S7: preparing a cathode on the interfacial modification layer to obtain the quantum dot light-emitting diode.

In particular, in a preferred embodiment, a method for fabricating a quantum dot light-emitting diode in an inverted structure comprises the following steps:

Step S1: preparing a cathode on a substrate;

Step S2: prepare an electron transport layer on the cathode;

Step S3: introducing the interfacial modification layer made of the ultraviolet absorbing material as described in the above on the electron transport layer;

Step S4: preparing a quantum dot light-emitting layer on the interfacial modification layer;

Step S5: preparing a hole transport layer on the quantum dot light-emitting layer;

Step S6: preparing a hole injection layer on the hole transport layer; and

Step S7: preparing an anode on the hole injection layer to obtain the quantum dot light-emitting diode.

In particular, in a preferred embodiment, a method for fabricating a quantum dot light-emitting diode in an inverted structure comprises the following steps:

Step S1: preparing a cathode on a substrate;

Step S2: introducing the interfacial modification layer made of the ultraviolet absorbing material as described in the above on the cathode;

Step S3: preparing an electron transport layer on the interfacial modification layer;

Step S4: preparing a quantum dot light-emitting layer on the electron transport layer;

Step S5: preparing a hole transport layer on the quantum dot light-emitting layer;

Step S6: preparing a hole injection layer on the hole transport layer; and

Step S7: preparing an anode on the hole injection layer to obtain the quantum dot light-emitting diode.

Among the above-mentioned four fabrication methods of the quantum dot light-emitting diode, the interfacial modification layer made of the ultraviolet absorbing material is prepared by a solution method, including but not limited to spin coating, printing, scrape coating, dip-coating, immersion, spraying, roller coating, casting, slot die coating, and stripe coating. Specifically, the ultraviolet absorbing material is firstly dissolved in a solvent to prepare the ultraviolet absorbing material-containing solution having a concentration of 0.03-120 mmol/L (optionally, 0.05-30 mmol/L), and then deposited by a solution method on a specific functional layer obtained from the fabrication method, a resulting product is annealed at 25-120° C. (optionally, 60-100° C.) for 0-60 min to obtain the interfacial modification layer. The interfacial modification layer has a thickness of 2-90 nm. The solvent is an organic solvent, including but not limited to a mixed organic solvent formed by one or more selected from the group consisting of a saturated hydrocarbon, an unsaturated hydrocarbon, an aromatic hydrocarbon, an alcohol solvent, an ether solvent, a ketone solvent, a nitrile solvent, an ester solvent, and derivatives thereof. In particular, the solvent is optionally an alcohol solvent, including but not limited to one or more of a monohydric alcohol, a polyhydric alcohol, and an aromatic alcohol, and specifically including, but not limited to, one or more of methanol, ethanol, ethylene glycol, propanol, propylene glycol, glycerin, isopropanol, butanol, pentanol, hexanol, cyclohexanol, n-butanol, benzyl alcohol, and phenethyl alcohol.

Among the above four fabrication methods of the quantum dot light-emitting diode, in addition to the interfacial modification layer made of the ultraviolet absorbing material, preparation of the other layers may be achieved by chemical methods or physical layers. The chemical methods include but are not limited to one or more of chemical vapor deposition method, continuous ion layer adsorption and reaction method, the anode oxidation method, electrolytic deposition method, and co-precipitation method. The physical methods include but are not limited to physical coating methods or solution methods, of which, the solution methods include but are not limited to spin coating, printing, scrape coating, dip-coating, immersion, spraying, roller coating, casting, slot die coating, and stripe coating; while the physical coating methods include but are not limited to one or more of thermal evaporation coating, electron beam evaporation coating, magnetron sputtering, multi-arc ion coating, physical vapor deposition, atomic layer deposition, and pulsed laser deposition.

For the composite electron transport layer formed by a mixture of the electron transport material and the ultraviolet absorbing material, the following two cases are included:

In particular, in another preferred embodiment, a method for fabricating a quantum dot light-emitting diode in a positive structure comprises the following steps:

Step S1: preparing an anode on a substrate;

Step S2: preparing a hole injection layer on the anode;

Step S3: preparing a hole transport layer on the hole injection layer;

Step S4: preparing a quantum dot light-emitting layer on the hole transport layer;

Step S5: uniformly mixing the electron transport material with the ultraviolet absorbing material as described in the above in advance to prepare a mixed solution, and then depositing the mixed solution on the quantum dot light-emitting layer to form a composite electron transport layer formed by a mixture of the electron transport material and the ultraviolet absorbing material; and Step S6: preparing the cathode on the composite electron transport layer obtained in step S5 to obtain the quantum dot light-emitting diode.

In particular, in a preferred embodiment, a method for fabricating a quantum dot light-emitting diode in an inverted structure comprises the following steps:

Step S1: preparing a cathode on a substrate;

Step S2: mixing an electron transport material with the ultraviolet absorbing material as described in the above in advance to prepare a mixed solution, and then depositing the mixed solution on the cathode to form a composite electron transport layer formed by a mixture of the electron transport material and the ultraviolet absorbing material;

Step S3: preparing the quantum dot light-emitting layer on the composite electron transport layer obtained in step S2;

Step S4: preparing a hole transport layer on the quantum dot light-emitting layer;

Step S5: preparing a hole injection layer on the hole transport layer; and

Step S6: preparing an anode on the hole injection layer to obtain the quantum dot light-emitting diode.

In the above two fabrication methods of the quantum dot light-emitting diode, the preparation of the composite electron transport layer are specifically performed as follows: first, the above electron transport material and the above ultraviolet absorbing material are mixed uniformly and dissolved in a solvent to prepare a mixed solution, and then the mixed solution is deposited on a specific functional layer using the solution method to form the composite electron transport layer formed by the electron transport material and the ultraviolet absorbing material. The composite electron transport layer is prepared by a solution method, including but not limited to spin coating, printing, scrape coating, dip-coating, immersion, spraying, roller coating, casting, slot die coating, and stripe coating. In the mixed solution, the electron transport material has concentration of 0.05-200 mol/L, and the ultraviolet absorbing material has a concentration of 0.03-90 mmol/L (optionally, 0.05-23 mmol/L). In particular, after the preparation of the composite electron transport layer, annealing is performed at 25-120° C. (optionally at 30-100° C.) for 0-60 min. Optionally, the composite electron transport layer has a thickness of 2-170 nm. The solvent is an organic solvent, including but not limited to a mixed organic solvent formed by one or more selected from the group consisting of a saturated hydrocarbon, an unsaturated hydrocarbon, an aromatic hydrocarbon, an alcohol solvent, an ether solvent, a ketone solvent, a nitrile solvent, an ester solvent, and derivatives thereof. In particular, the solvent is optionally an alcohol solvent, including but not limited to one or more of a monohydric alcohol, a polyhydric alcohol, and an aromatic alcohol, and specifically including, but not limited to, one or more of methanol, ethanol, ethylene glycol, propanol, propylene glycol, glycerin, isopropanol, butanol, pentanol, hexanol, cyclohexanol, n-butanol, benzyl alcohol, and phenethyl alcohol.

Among the above two fabrication methods of the quantum dot light-emitting diode, in addition to the composite electron transport layer, preparation of the other layers may be achieved by chemical methods or physical layers. The chemical methods include but are not limited to one or more of chemical vapor deposition method, continuous ion layer adsorption and reaction method, the anode oxidation method, electrolytic deposition method, and co-precipitation method. The physical methods include but are not limited to physical coating methods or solution methods, of which, the solution methods include but are not limited to spin coating, printing, scrape coating, dip-coating, immersion, spraying, roller coating, casting, slot die coating, and stripe coating; while the physical coating methods include but are not limited to one or more of thermal evaporation coating, electron beam evaporation coating, magnetron sputtering, multi-arc ion coating, physical vapor deposition, atomic layer deposition, and pulsed laser deposition.

Finally, an embodiment of the present application further provides a printed quantum dot display screen, including the above-mentioned quantum dot light-emitting diode according to embodiments of the present application.

The present application has been tested multiple times, and a part of the test results will now be used as a reference to describe the present application in further detail. The following detailed description will be made in accompany with specific examples.

Example 1

A quantum dot light-emitting diode was fabricated as follows:

sinapoyl malate was firstly dissolved at a concentration of 0.2 mmol/L in methanol to obtain a sinapoyl malate solution, then the following process was conducted:

A. a PEDOT:PSS layer was spin coated on an ITO conductive glass;

B. a TFB layer was spin coated on the PEDOT:PSS layer;

C. a CdSe/ZnS quantum dot light-emitting layer was spin coated on the TFB layer;

D. the sinapoyl malate solution prepared in the above was deposited on the CdSe/ZnS quantum dot light-emitting layer by spin coating, in which, the spin coating condition was 3000 rpm; and after the spin coating, a film was heated and annealed at 80° C. for 30 min to yield a sinapoyl malate layer;

E. a ZnO electron transport layer was spin coated on the sinapoyl malate layer; and F. an Al cathode layer was vapor plated on the ZnO electron transport layer to obtain the quantum dot light-emitting diode.

Example 2

A quantum dot light-emitting diode was fabricated as follows:

sinapoyl malate was firstly dissolved at a concentration of 0.5 mmol/L in ethanol to obtain a sinapoyl malate solution, then the following process was conducted:

A. a PEDOT:PSS layer was spin coated on an ITO conductive glass;

B. a TFB layer was spin coated on the PEDOT:PSS layer;

C. a CdSe/ZnS quantum dot light-emitting layer was spin coated on the TFB layer;

D. a ZnO electron transport layer was spin coated on the CdSe/ZnS quantum dot light-emitting layer;

E. the sinapoyl malate solution prepared in the above was deposited on the ZnO electron transport layer by spin coating, in which, the spin coating condition was 3000 rpm; and after the spin coating, a film was heated and annealed at 80° C. for 30 min to yield a sinapoyl malate layer;

F. an Al cathode layer was vapor plated on the sinapoyl malate layer to obtain the quantum dot light-emitting diode.

Example 3

A quantum dot light-emitting diode was fabricated as follows:

sinapoyl malate was firstly dissolved at a concentration of 0.5 mmol/L in ethanol to obtain a sinapoyl malate solution, then the following process was conducted:

A. a ZnO electron transport layer was spin coated on an ITO conductive glass;

B. the sinapoyl malate solution prepared in the above was deposited on the ZnO electron transport layer by spin coating, in which, the spin coating condition was 3000 rpm;

and after the spin coating, a film was heated and annealed at 80° C. for 30 min to yield a sinapoyl malate layer;

C. a CdSe/ZnS quantum dot light-emitting layer was spin coated on the sinapoyl malate layer;

D. a TCTA layer was vapor plated on the CdSe/ZnS quantum dot light-emitting layer;

E. an NPB layer is vapor plated on the TCTA layer;

F. a HATCN layer is vapor plated on the NPB layer; and

G. an Al cathode layer is vapor plated on the HATCN layer to yield the quantum dot light-emitting diode.

Example 4

A quantum dot light-emitting diode was fabricated as follows:

sinapoyl malate was firstly dissolved at a concentration of 0.8 mmol/L in ethanol to obtain a sinapoyl malate solution, then the following process was conducted:

A. the sinapoyl malate solution prepared in the above was deposited on an ITO conductive glass by spin coating, in which, the spin coating condition was 1500 rpm; and after the spin coating, a film was heated and annealed at 100° C. for 30 min to yield a sinapoyl malate layer;

B. a ZnO electron transport layer was spin coated on the sinapoyl malate layer;

C. a CdSe/ZnS quantum dot light-emitting layer was spin coated on the ZnO electron transport layer;

D. a TCTA layer was vapor plated on the CdSe/ZnS quantum dot light-emitting layer;

E. an NPB layer is vapor plated on the TCTA layer;

F. a HATCN layer is vapor plated on the NPB layer; and

G. an Al cathode layer is vapor plated on the HATCN layer to yield the quantum dot light-emitting diode.

Example 5

A quantum dot light-emitting diode was fabricated as follows:

zinc oxide and sinapoyl malate were firstly dissolved in ethanol to yield a mixed solution of zinc oxide and sinapoyl malate, in which, a concentration of zinc oxide was 1 mmol/L, and a concentration of sinapoyl malate was 0.2 mmol/L, then the following process was conducted:

A. a PEDOT:PSS layer was spin coated on an ITO conductive glass;

B. a TFB layer was spin coated on the PEDOT:PSS layer;

C. a CdSe/ZnS quantum dot light-emitting layer was spin coated on the TFB layer;

D. the mixed solution of zinc oxide and sinapoyl malate prepared in the above was deposited on the CdSe/ZnS quantum dot light-emitting layer by spin coating, in which, the spin coating condition was 3000 rpm; and after the spin coating, a film was heated and annealed at 80° C. for 30 min to yield a composite electron transport layer;

E. an Al cathode layer was vapor plated on the composite electron transport layer to obtain the quantum dot light-emitting diode.

Example 6

A quantum dot light-emitting diode was fabricated as follows:

zinc oxide and sinapoyl malate were firstly dissolved in ethanol to yield a mixed solution of zinc oxide and sinapoyl malate, in which, a concentration of zinc oxide was 1 mmol/L, and a concentration of sinapoyl malate was 0.2 mmol/L, then the following process was conducted:

A. the mixed solution of zinc oxide and sinapoyl malate prepared in the above was deposited on an ITO conductive glass by spin coating, in which, the spin coating condition was 1500 rpm; and after the spin coating, a film was heated and annealed at 100° C. for 30 min to yield a composite electron transport layer;

B. a CdSe/ZnS quantum dot light-emitting layer was spin coated on the composite electron transport layer;

C. a TCTA layer was vapor plated on the CdSe/ZnS quantum dot light-emitting layer;

D. an NPB layer is vapor plated on the TCTA layer;

E. a HATCN layer is vapor plated on the NPB layer; and

F. an Al cathode layer is vapor plated on the HATCN layer to yield the quantum dot light-emitting diode.

The above are only preferred embodiments of the present application and are not intended to limit the present application. Any modification, equivalent replacement, and improvement made within the spirit and principle of the present application should be included in the protection scope of the present application.

What is claimed is:

1. A quantum dot light-emitting diode, comprising: an anode, a cathode, and a quantum dot light-emitting layer arranged between the anode and the cathode;
   wherein
   a composite electron transport layer is arranged between the cathode and the quantum dot light-emitting layer, and the composite electron transport layer contains an electron transport material and an ultraviolet absorbing material; and
   the ultraviolet absorbing material is at least one selected from the group consisting of cinnamic acid, a cinnamic acid derivative, salicylic acid, a salicylic acid derivative, methoxyphenone, a methoxyphenone derivative, benzotriazole, a benzotriazole derivative, cyanoacrylic acid, a cyanoacrylic acid derivative, benzoic acid, the benzoic acid derivative, a hindered amine compound, an organic nickel compound, phenylbenzimidazole sulfonic acid, terephthalylidene dicamphor sulfonie acid, drometrizde trisiloxane, butyl methoxydibenzoylmethane, and 3-(4-methylbenzylidene)-camphor.

2. The quantum dot light-emitting diode of claim 1, wherein the composite electron transport layer comprises: an electron transport layer made of the electron transport material, and an interfacial modification layer made of the ultraviolet absorbing material, wherein
   the interfacial modification layer is arranged between the electron transport layer and the cathode; or alternatively, the interfacial modification layer is arranged between the electron transport layer and the quantum dot light-emitting layer.

3. The quantum dot light-emitting diode of claim 1, wherein the composite electron transport layer comprises: a first interfacial modification layer, an electron transport layer, and a second interfacial modification layer that are stacked; the electron transport layer is made of the electron transport material, and the first interfacial modification layer and the second interfacial modification layer are made of the ultraviolet absorbing material, wherein
   the first interfacial modification layer is arranged between the electron transport layer and the cathode; and the second interfacial modification layer is arranged between the electron transport layer and the quantum dot light-emitting layer.

4. The quantum dot light-emitting diode of claim 2, wherein the interfacial modification layer has a thickness of 2-90 nm.

5. The quantum dot light-emitting diode of claim 3, wherein the first interfacial modification layer has a thickness of 2-90 nm; and
the second interfacial modification layer has a thickness of 2-90 nm.

6. The quantum dot light-emitting diode of claim 1, wherein the composite electron transport layer is formed by a mixture of the electron transport material and the ultraviolet absorbing material.

7. The quantum dot light-emitting diode of claim 6, wherein the composite electron transport layer has a thickness of 2-170 nm; and
the electron transport material and the ultraviolet absorbing material are mixed at a molar ratio of (0.05-200):(0.03-90).

8. The quantum dot light-emitting diode of claim 1, wherein the electron transport material is selected from a metal oxide electron transport material.

9. The quantum dot light-emitting diode of claim 8, wherein the cinnamic acid derivative is at least one selected from the group consisting of octyl methoxycinnamate, isooctyl methoxycinnamate, 2-ethylhexyl 4-methoxycinnamate, pentaerythrityl tetra-di-t-butyl hydroxyhydrocinnamate, sinapic acid, and a sinapic acid derivative; and
the salicylic acid derivative is at least one selected from the group consisting of octyl salicylate, homosalate, phenyl 3,5-dichlorosalicylate, 4,4'-isopropylidene-bis(phenolsalicylate), p-tert-butylphenyl salicylate, and p-octylphenyl salicylate; and
the methoxyphenone derivative is at least one selected from the group consisting of 2-hydroxy-4-n-octyloxy-benzophenone, 2-hydroxy-4-methoxybenzophenone, 2,4-dihydroxybenzophenone, benzophenone-3, 2-hydroxy-4-(2'-ethylhexoxy)-benzophenone, 2-hydroxy-4-dodecyl-benzophenone, 2-hydroxy-4-methoxy-2'-carboxybenzophenone, 2-hydroxy-4(2'-hydroxy-3'-acryloxypropoxy) benzophenone, 2-hydroxy-4-[2'-hydroxy-3'-(methacryloxypropoxy)] benzophenone, 2,2'-dihydroxy-4-n-octyloxybenzophenone, 2-hydroxy-4-methoxy-4-chlorobenzophenone, 2-hydroxy-4-methoxy-2',4'-dichlorobenzophenone, 1,3-bis(3'-hydroxy-4'-benzoylphenoxy)-2-propanol, 2-hydroxy-4-octadecyloxybenzophenone, 2,2'-dihydroxy-methoxybenzophenone, 2,2'-dihydroxy-4,4'-dimethoxybenzophenone, 2,2',4,4'-tetrahydroxybenzophenone, and 2-hydroxy-4-acryloyloxyethoxybenzophenone; and
the benzotriazole derivative is at least one selected from the group consisting of 2-(2'-hydroxy-3',5'-di-tert-phenyl)-5-chlorobenzotriazole, 2-(2'-hydroxy-5'-methylphenyl)benzotriazole, 2-(2'-hydroxy-5'-methylphenyl)benzotriazole, (2'-hydroxy-3'-tert-butyl-5'-methylphenyl)-5-chlorobenzotriazole, 2-(2'-hydroxy-3',5'-di-tert-butylphenyl)-5-chlorobenzotriazole, methyl 3-(3-(2H-benzotriazol-2-yl)5-tert-butyl-4-hydroxyphenyl) acrylate, 2-(2'-hydroxy-3',5'-dipentylphenyl)benzotriazole, 2-(2'-hydroxy-4'-n-octyloxyphenyl)benzotriazole, 2-(2'-hydroxy-5'-tert-octylphenyl)benzotriazole, 2-(2H-benzotriazol-2-yl)-4-(tert-butyl-6-sec-butyl)phenol, 2-(2H-benzotriazol-2-yl)-4,6-bis(1-methyl-1-phenylethyl)phenol, 2,2'-methylenebis(6-(2H-benzotriazol-2-yl)-4-(1,1,3,3-tetramethylbutyl)phenol), 2-(2H-benzotriazol-2-yl)-6-(dodecyl)-4-methylphenol, and methylenebis-benzotriazolyltetramethylbutylphenol; and
the cyanoacrylic acid derivative is at least one selected from the group consisting of 2-cyano-3,3-diphenylacrylic acid 2-ethylhexyl ester, 2-cyano-3,3'-diphenyl ethyl acrylate, and 2-cyano-3,3-diphenyl isooctyl acrylate; and
the benzoic acid derivative is at least one selected from the group consisting of diethylaminohydroxybenzoyl hexyl benzoate, 2-ethylhexyl-4-dimethylaminobenzoate, octyl-dimethyl-p-aminobenzoic acid, phenyl 2-hydroxybenzoate, m-phenylene dibenzoate, 3,5-di-tert-butyl-4-hydroxybenzoic acid-2,4-di-tert-butylphenyl ester, and 3,5-di-tert-butyl-4-hydroxybenzoic acid n-hexadecyl ester; and
the hindered amine compound is at least one selected from the group consisting of ethyl bis (2,2,6,6-tetramethylpiperazinone), 4-benzoyloxy-2,2,6,6tetramethylpiperidine, 2-(3,5-di-tert-butyl-4-hydroxy-benzyl)-2-butyl 1,3-malonic acid bis (1,2,2,6,6-pentamethyl-4-piper pyridyl) ester, tetra(2,2,6,6-tetramethyl-4-piperidinyl)-1,2,3,4-butane tetracarboxylate, bis (2,2,6,6-tetramethylpiperidinyl) sebacate, poly-{[6-[(1,1,3,3-tetramethylbutyl)-imino]-1,3,5, -triazine-2,4-diyl] [2-(2, 2,6,6, -tetramethylpiperidinyl)-imino-hexamethylene-[4-(2,2,6,6-tetramethylpyridinyl)-imino]], polymers of succinic acid and 4-hydroxy-2,2,6,6-tetramethyl-1-piperidinol, [[6-[(1, 1, 3,3-tetramethylbutyl) amino] s-triazine-2,4-di] [[(2,2,6,6-tetramethyl-4-piperidinyl) imino] hexylidene [(2,2,6,6-tetramethyl-4-piperidinyl) imino]] polymer, bis (or tri) (2,2,6,6-tetramethyl-4-piperidinyl)-bis (or mono) tridecyl-1,2,3,4-butane tetracarboxylate, bis (or tri) (1,2,2,6,6-pentamethyl-4-piperidinyl)-bis (or mono) tridecyl-1,2,3,4-butane tetracarboxylic acid ester, 4-(p-toluenesulfonamido)-2,2,6,6-tetramethylpiperidine, bis (1,2,2,6,6-pentamethyl 4-piperidinyl)-sebacate, N-triacetic acid (2,2,6,6-tetramethyl-4-piperidinyl) ester, N-triacetic acid (1,2,2,6,6-pentamethyl-4-piperidinyl) ester, tris (1,2,2,6,6-pentamethyl-4-piperidinyl)-phosphite, poly-(4(2,2,6,6-tetramethylpiperidinyl) imino-hexamethylene [4-(2,2,6,6-tetramethylpiperidinyl) imino]-ethylene, bis(1-octyloxy-2,2,6,6-tetramethyl-4-piperidinyl) sebacate, and hexamethylphosphoric triamide; and
the organic nickel compound is at least one selected from the group consisting of nickel tetra-n-butyl dithiocarbamate, 2,2'-thiobis (p-tert-octylphenol) nickel-n-butylamine complex, 2,2'-thiobis (p-tert-octylphenol) nickel, and 2,2'-thiobis (4-tert-octylphenoloxy) nickel.

10. The quantum dot light-emitting diode of claim 8, wherein the metal oxide electron transport material is at least one selected from ZnO, $TiO_2$, $SnO_2$, $Ta_2O_3$, $ZrO_2$, NiO, TiLiO, ZnAlO, ZnMgO, ZnSnO, ZnLiO, and InSnO.

11. The quantum dot light-emitting diode of claim 1, wherein an electron injection layer is arranged between the cathode and the composite electron transport layer; and
a hole function layer is arranged between the anode and the quantum dot light-emitting layer.

12. A method for fabricating a quantum dot light-emitting diode, comprising the following steps:
preparing a composite electron transport layer on a cathode or a quantum dot light-emitting layer, wherein the composite electron transport layer contains an electron transport material and an ultraviolet absorbing material;

wherein
the ultraviolet absorbing material is at least one selected from the group consisting of cinnamic acid, a cinnamic acid derivative, salicylic acid, a salicylic acid derivative, methoxyphenone, a methoxyphenone derivative, benzotriazole, a benzotriazole derivative, cyanoacrylic acid, a cyanoacrylic acid derivative, benzoic acid, the benzoic acid derivative, a hindered amine compound, an organic nickel compound, phenylbenzimidazole sulfonic acid, terephthalylidene dicamphor sulfonic acid, drometrizde trisiloxane, butyl methoxydibenzoylmethane, and 3-(4-methylbenzylidene)-camphor.

13. The method of claim 12, wherein the step of preparing the composite electron transport layer on the cathode or the quantum dot light-emitting layer comprises:
mixing the electron transport material and the ultraviolet absorbing material to obtain a composite material; and
depositing the composite material on the cathode or the quantum dot light-emitting layer to obtain the composite electron transport layer formed by a mixture of the electron transport material and the ultraviolet absorbing material.

14. The method of claim 13, wherein the step of depositing the composite material on the cathode or the quantum dot light-emitting layer to obtain the composite electron transport layer formed by the mixture of the electron transport material and the ultraviolet absorbing material, comprises:
dissolving the composite material in a solvent to prepare a mixed solution, then depositing the mixed solution on the cathode or the quantum dot light-emitting layer, and performing annealing treatment.

15. The method of claim 14, wherein in the mixed solution, the electron transport material has a concentration of 0.05-200 mol/L; and
the ultraviolet absorbing material has a concentration of 0.03-90 mmol/L.

16. The method of claim 14, wherein the annealing treatment is performed at a temperature of 25-120° C.

17. The method of claim 12, wherein the step of preparing the composite electron transport layer on the cathode or the quantum dot light-emitting layer comprises:
depositing the electron transport material on the cathode or the quantum dot light-emitting layer to obtain an electron transport layer; and
depositing the ultraviolet absorbing material on the electron transport layer to obtain an interfacial modification layer;
wherein the interfacial modification layer and the electron transport layer form the composite electron transport layer.

18. The method of claim 17, wherein the step of depositing the ultraviolet absorbing material on the electron transport layer to obtain the interfacial modification layer comprises:
dissolving the ultraviolet absorbing material in a solvent to obtain an ultraviolet absorbing material-containing solution, then depositing the ultraviolet absorbing material-containing solution on the electron transport layer, and performing annealing treatment.

19. The method of claim 12, wherein the step of preparing the composite electron transport layer on the cathode or the quantum dot light- emitting layer comprises:
depositing the ultraviolet absorbing material on the cathode or the quantum dot light-emitting layer to obtain an interfacial modification layer; and
depositing the electron transport material on the interfacial modification layer to obtain an electron transport layer;
wherein the interfacial modification layer and the electron transport layer form the composite electron transport layer.

20. The method of claim 19, wherein the step of depositing the ultraviolet absorbing material on the cathode or the quantum dot light-emitting layer to obtain the interfacial modification layer comprises:
dissolving the ultraviolet absorbing material in a solvent to obtain an ultraviolet absorbing material-containing solution, then depositing the ultraviolet absorbing material-containing solution on the cathode or the quantum dot light-emitting layer, and performing annealing treatment.

* * * * *